(12) United States Patent
Tam et al.

(10) Patent No.: US 8,493,118 B2
(45) Date of Patent: Jul. 23, 2013

(54) LOW POWER SCANNABLE LATCH

(75) Inventors: Honkai Tam, Redwood City, CA (US); Bo Tang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 413 days.

(21) Appl. No.: 12/892,753

(22) Filed: Sep. 28, 2010

(65) Prior Publication Data

US 2012/0079334 A1    Mar. 29, 2012

(51) Int. Cl.
*H03K 3/356* (2006.01)
*H03K 3/289* (2006.01)

(52) U.S. Cl.
USPC .......................................... 327/202; 327/203

(58) Field of Classification Search
None
See application file for complete search history.

(56) References Cited

U.S. PATENT DOCUMENTS

| | | | |
|---|---|---|---|
| 5,015,875 A | 5/1991 | Giles et al. | |
| 5,633,606 A * | 5/1997 | Gaudet et al. | 327/202 |
| 5,719,878 A | 2/1998 | Yu et al. | |
| 5,784,384 A * | 7/1998 | Maeno | 714/726 |
| 6,788,105 B2 * | 9/2004 | Kono | 326/46 |
| 6,853,212 B2 * | 2/2005 | Chandar et al. | 326/16 |
| 6,986,089 B2 * | 1/2006 | Hill et al. | 714/726 |
| 7,203,876 B2 | 4/2007 | Allen et al. | |
| 7,262,648 B2 * | 8/2007 | Aksamit | 327/202 |
| 7,301,372 B2 * | 11/2007 | Anderson et al. | 326/95 |
| 7,596,732 B2 * | 9/2009 | Branch et al. | 714/726 |
| 7,613,969 B2 * | 11/2009 | Bhatia | 714/729 |
| 7,843,218 B1 * | 11/2010 | Ramaraju et al. | 326/46 |
| 8,305,126 B2 * | 11/2012 | Smith et al. | 327/202 |
| 2002/0005745 A1 * | 1/2002 | Robertson et al. | 327/218 |
| 2006/0095819 A1 * | 5/2006 | Bhatia | 714/726 |
| 2006/0273837 A1 * | 12/2006 | Shimazaki et al. | 327/202 |
| 2008/0084235 A1 * | 4/2008 | Russell et al. | 327/218 |
| 2008/0115025 A1 | 5/2008 | Frederick | |

* cited by examiner

*Primary Examiner* — Tuan T Lam
(74) *Attorney, Agent, or Firm* — Meyertons, Hood, Kivlin, Kowert & Goetzel PC; Lawrence J. Merkel; Erik A. Heter

(57) ABSTRACT

A scannable latch circuit is disclosed. In one embodiment, the scannable latch circuit includes a master latch, a slave latch, and a gating circuit coupled between the master latch and the slave latch. The slave latch may be implemented to support scan-shifting for test operations. Scan data received by the master latch may be provided to the slave latch through the gating circuit. The gating circuit may enable data to be transferred from the master latch to the slave latch when a scan enable signal is asserted. When the scan enable signal is deasserted, the gating circuit may cause the slave latch to output a constant (i.e. unchanging) state, regardless of the state of data stored in the master latch. This may result in power savings by inhibiting the slave latch from making state changes when scan-shifting operations are not in progress.

25 Claims, 6 Drawing Sheets

US 8,493,118 B2

LOW POWER SCANNABLE LATCH

BACKGROUND

1. Field of the Invention

This invention relates to electronic circuits, and more particularly, to latch circuits.

2. Description of the Related Art

Many integrated circuits (ICs) include a large number of storage circuits. Latches are one type of storage circuit that may be implemented on an IC. A latch circuit may store a bit of data depending based on received input data. The storing of data by a latch circuit may be performed in accordance with a clock signal. Whereas some types of storage circuits are triggered according to an edge of a clock signal (e.g., flip-flops), latch circuits may be sensitive to the level of the clock signals (i.e. high or low).

In some ICs, latch circuits may be implemented as scannable elements, thereby including extra circuitry to support scan testing. To conduct a scan test, test stimulus data may be input into an IC through a serially coupled chain of scannable elements. Each scannable element may include a data input, a scan data input, a data output, and a scan data output. The scan data output of all but the last scannable element may be coupled to the scan data input of a next scannable element. Test stimulus data may be shifted into each scannable element through its scan data input, and applied to logic circuitry (e.g., combinational logic) via its data output. Subsequent to applying the test stimulus data, test result data may be on the data input of each scannable element. Subsequent to capture, the test result data may be shifted through the scan chain via the scan data input and scan data output of each scan chain.

When operating in a normal mode (i.e. when not conducting scan testing), data may be applied to the data input of each scannable element, while data may be conveyed from the data output of each scannable element. During normal mode operations, the data received by a scannable element may cause a change of state to its scan data output. However, since the scan data output of each scannable element is coupled to the scan data input of another scannable element (save for the last scannable element in the chain), such changes may occur without affecting the states of data on the (normal) data inputs and outputs.

SUMMARY

A scannable latch circuit enabled to hold constant a state of a scan data output when not conducting scan operations is disclosed. In one embodiment, the scannable latch circuit includes a master latch, a slave latch, and a gating circuit coupled between the master latch and the slave latch. The slave latch may be implemented to support scan shifting for test operations. Scan data received by the master latch may be provided to the slave latch through the gating circuit. The gating circuit may enable data to be transferred from the master latch to the slave latch when a scan enable signal is asserted. When the scan enable signal is deasserted, the gating circuit may cause the slave latch to output a constant (i.e. unchanging) state, regardless of the state of data stored in the master latch. This may result in power savings by inhibiting the slave latch from making state changes when scan-shifting operations are not in progress. Since there may be numerous scannable latch circuits on a single integrated circuit die, these power savings may be significant.

In one embodiment, the master latch may include both a normal data input and the scan data input. During a normal mode of operation, data may be received through the normal data input and latched, responsive to a clock signal, to a normal data output of the master latch. The gating circuit may inhibit state changes on the normal data input from affecting the scan data output by preventing received data from being conveyed to the slave latch.

During scan-shifting operations, the master latch may receive data through the scan data input, and may set a state of an internal node of the master latch to a corresponding state when a clock signal is at a first level. The gating circuit may set a state of an internal node of the slave latch responsive to the clock signal transitioning to a second level.

BRIEF DESCRIPTION OF THE DRAWINGS

The following detailed description makes reference to the accompanying drawings, which are now briefly described.

Figure 1:
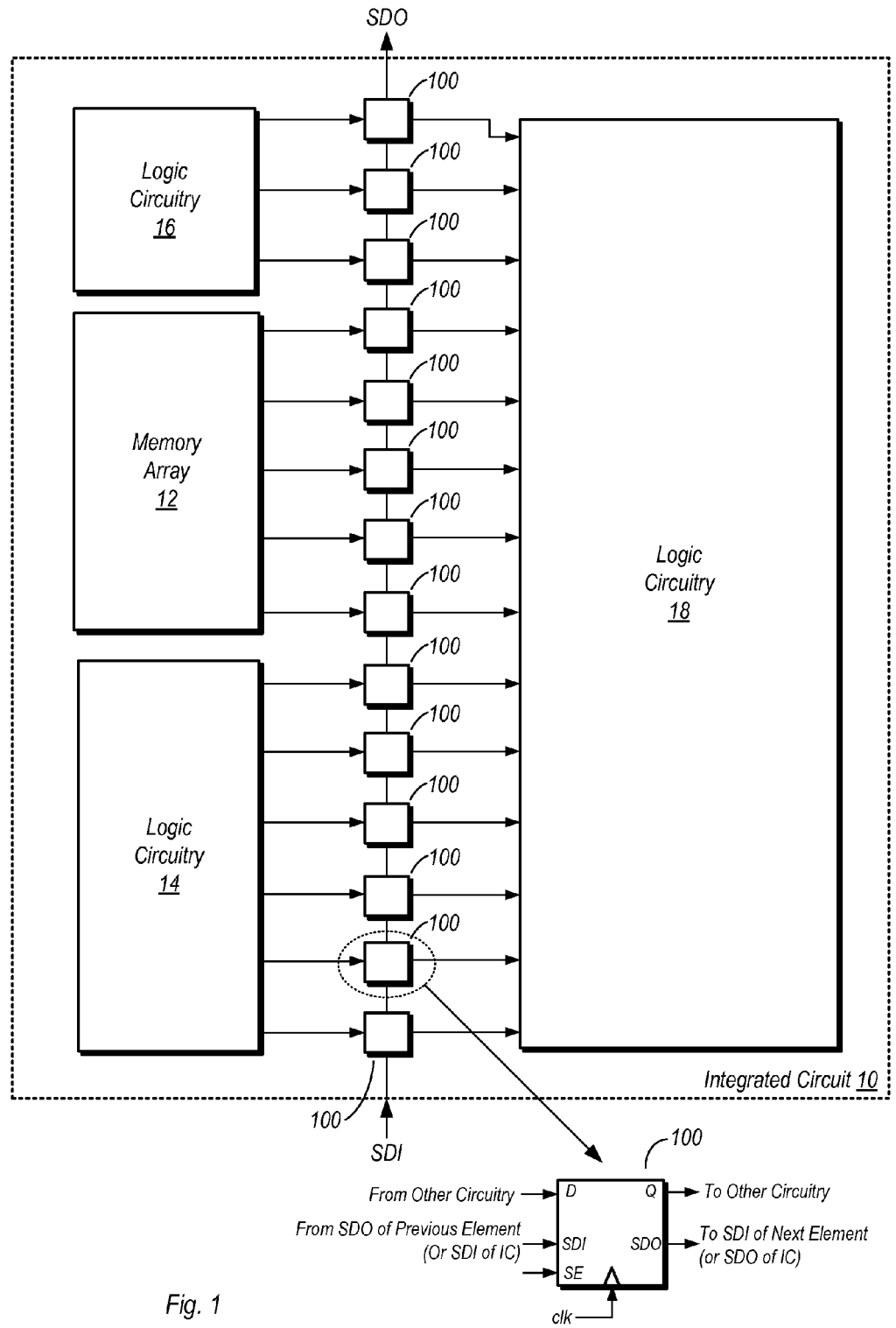
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with Scan Chain:

FIG. 1 is a block diagram of one embodiment of an integrated circuit (IC) having a scan chain. In the embodiment shown, integrated circuit (IC) 10 includes logic circuits 14, 16, 18 and a memory array 12. Logic circuits 16, 14, and 18 may include various combinational logic circuits. Memory array 12 may be a memory implemented using any suitable type of memory circuitry (e.g., static random access memory, (SRAM)).

IC 10 may include one or more scan chains. In the embodiment of FIG. 1, a scan chain including a number of serially coupled scannable elements 100 is shown. An exemplary one of scannable elements 100 is also shown in the drawing as a D flip-flop. Each scannable element 100 includes a 'D' input coupled to receive a data bit from other circuitry (e.g., from logic circuit 14), and a 'Q' output coupled to provide a data bit to other circuitry (e.g., to logic circuitry 18). During normal operations of IC 10, scannable element 100 may receive data through the 'D' input and may provide data through the 'Q' output. Data may be received into or provided from scannable element 100 in accordance with a clock signal ('clk'). During normal operations of IC 10, scannable element 100 may be used as a storage circuit that retains data generated by and/or to be received by other logic circuits.

Each scannable element 100 in the embodiment shown is configured for scan test operations. To support scan testing, each of scannable elements 100 includes a scan data input 'SDI', a scan data output 'SDO', and a scan enable input, 'SE'. The SDI terminal of each scannable element 100, with the exception of the very first one in the chain, is coupled to the SDO terminal of the previous scannable element 100. Thus, the SDO terminal of each scannable element 100, except for the very last one in the chain, is coupled to the SDI terminal of the next scannable element 100. Embodiments of scannable elements 100 will be discussed in further detail below.

Test stimulus data may input into IC 10 by providing it to the SDI terminal of the first scannable element 100 in the chain and shifting the data from one scannable element 100 to the next until each bit has reached its intended scan element. Shifting of data from one scannable element 100 to the next may be enabled responsive to the assertion of a scan enable signal on the SE terminal of each of scannable elements 100. Shifting may be conducted in accordance with a clock signal that may be received on the 'clk' input of each scannable element 100. The 'clk' input may also be used to receive the functional clock signal during normal operations of IC 10.

During the actual test operations, a scannable element 100 may provide, via its Q output, a bit of test stimulus data to logic circuitry coupled thereto (e.g., from a scannable element 100 to logic circuitry 18), responsive to a cycle of a functional clock signal. Test result data may be captured by a scannable element 100, via its D input, from logic circuitry coupled thereto (e.g., from logic circuitry 16). Similarly, the outputs of the logic circuitry 18 may be input into other flops not explicitly shown in FIG. 1. The test result data may then be shifted from the scan chain in the same manner in which test stimulus data was shifted into IC 10. The test result data may be received by a test system via the SDO terminal of the last scannable element 100 in the chain.

Figure 2:
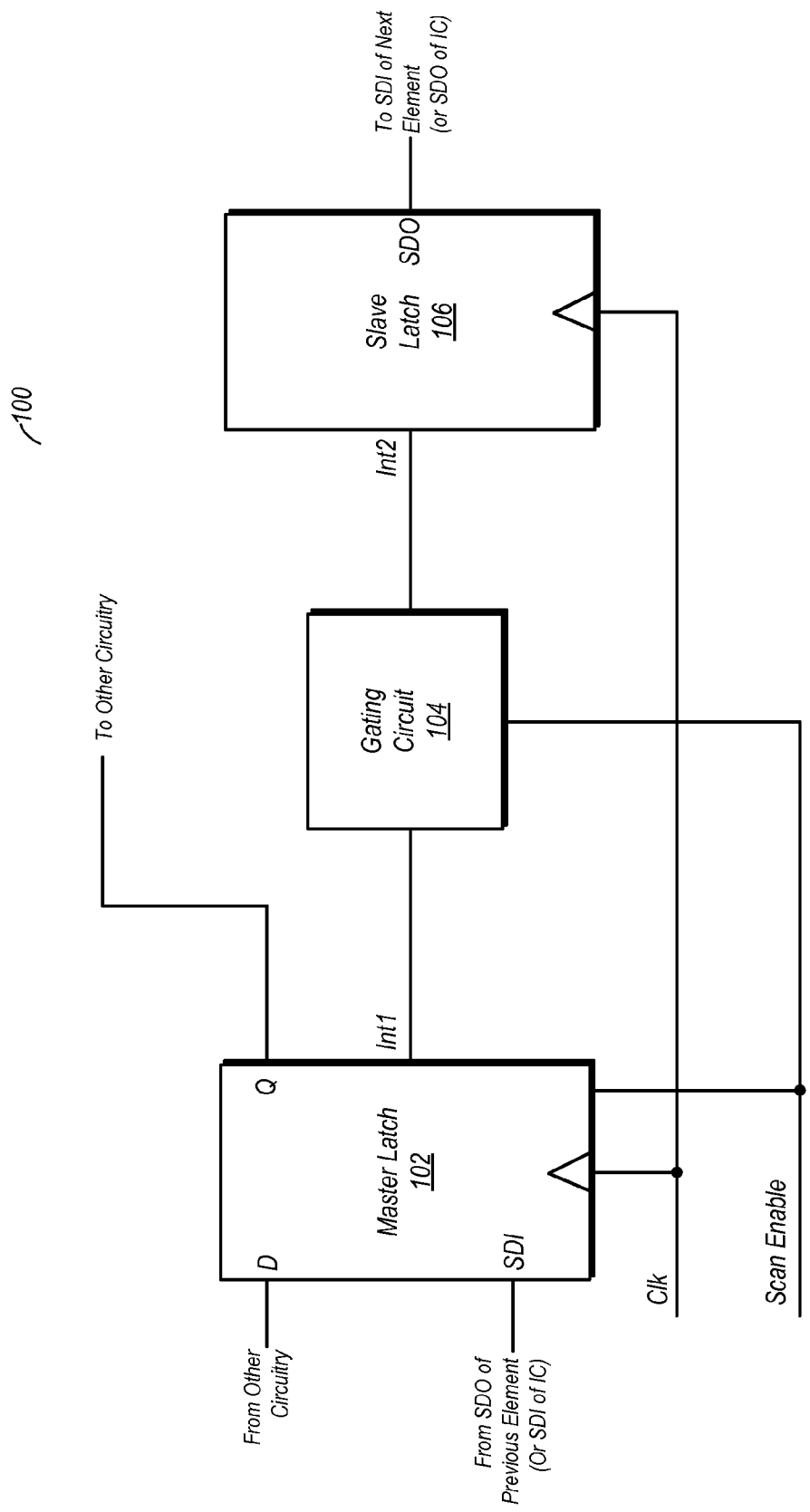
FIG. 2 is a block diagram of one embodiment of a scannable latch.

Low Power Scannable Latch:

Turning now to FIG. 2, a block diagram of one embodiment of a scannable latch is shown. In the embodiment shown, scannable element 100 is a latch circuit including a master latch 102, a gating circuit 104, and a slave latch 106. Master latch 102 includes both a normal data input ('D') for receiving data and a normal data output ('Q') for outputting data, both during normal operations. Scannable element 100 is further configured to support scan testing, and thus includes a scan data input ('SDI') for receiving scan data and a scan data output ('SDO) for providing scan data, both during scan-shifting operations. Data received via the normal data input or the scan data input may be selected dependent upon a state of a scan enable signal receivable by master latch 102. When the scan enable signal is asserted (e.g., during scan-shifting operations), master latch 102 may receive data through the scan data input. When the scan enable signal is deasserted (e.g., during normal operations), master latch 102 may receive data through the normal data input.

In the embodiment shown, gating circuit 104 may control whether or not data received into master latch 102 may be conveyed to and through slave latch 106. In the embodiment shown, gating circuit 104 acts as a control unit that determines whether or not slave latch 106 is responsive to data latched into master latch 102. Gating circuit 104 as illustrated herein is coupled to receive the scan enable signal. When the scan enable signal is asserted, gating circuit 104 may set a state of an internal node of slave latch 106 ('Int2') in accordance with a current state of an internal node of master latch 102 ('Int1'). In some embodiments, gating circuit 104 may be controlled by a clock signal, and may thus be configured to set the state of the internal node of slave latch 106 when the clock signal is at a designated level.

When the scan enable signal is not asserted (e.g., when operating in a normal mode), gating circuit 104 may set the state of the internal node of slave latch 106 to a predetermined level, irrespective of the state present on the internal node of master latch 102. During normal mode operation, data may be latched into master latch 102 in accordance with the clock signal, and thus conveyed to the normal output, Q. In one embodiment, when the clock signal is high, the internal node of master latch may be set to a state in accordance with data present on the normal data input, D. The data received through the normal input may thus be conveyed to the normal output. When the clock signal transitions back to a low state, master latch 102 may retain the state present on the normal output after the clock falls low again.

Figure 3:
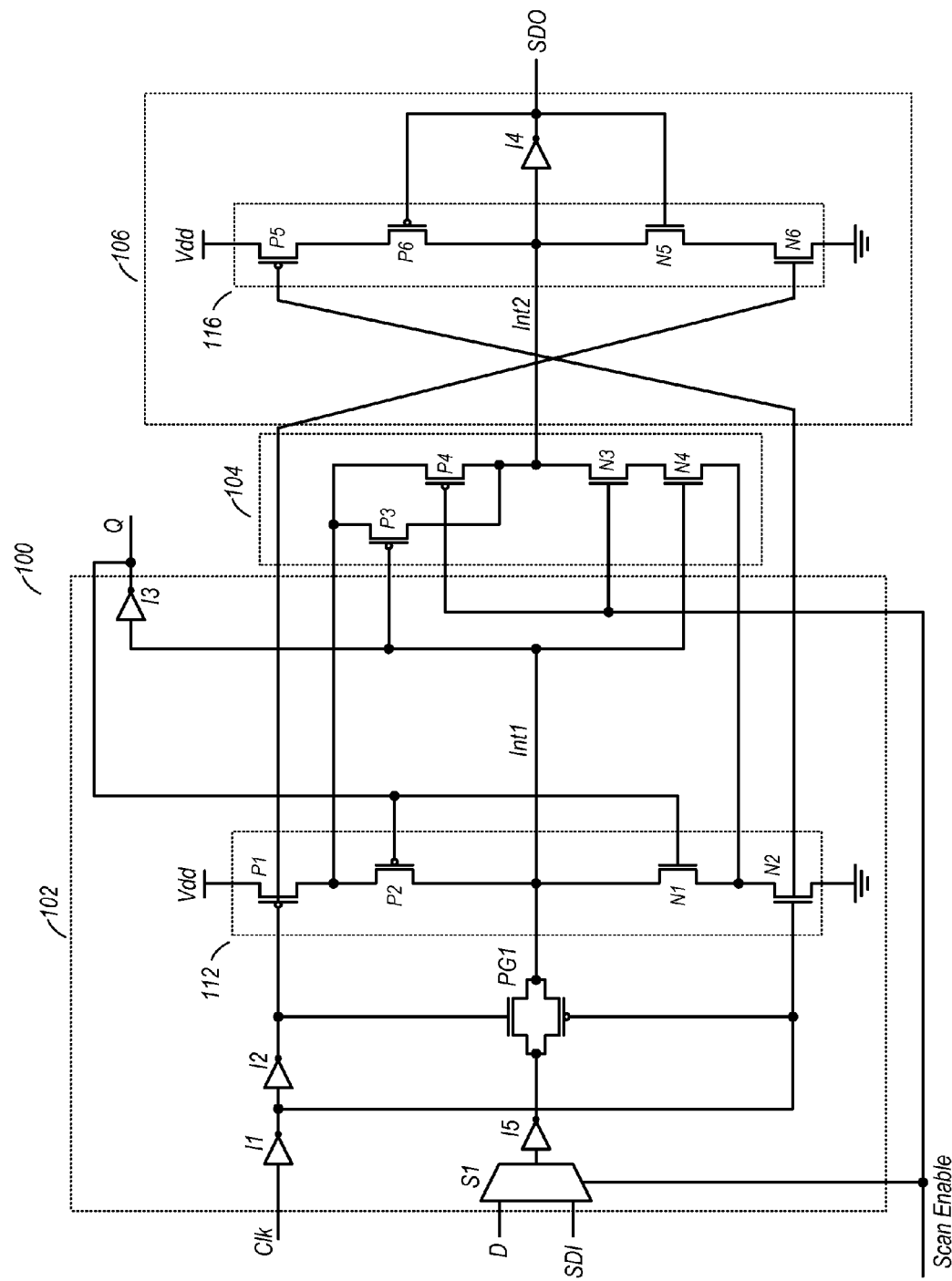
FIG. 3 is a schematic diagram of one embodiment of a scannable latch.

One embodiment of scannable element 100 is further illustrated in FIG. 3. More particularly, FIG. 3 is a schematic diagram of one embodiment of a scannable latch 100. In the embodiment shown, scannable element 100 includes the same basic components as discussed above, namely master latch 102, gating circuit 104, and slave latch 106. In addition, the illustrated embodiment also includes a first keeper 112 and a second keeper 116, within master latch 102 and slave latch 106, respectively.

In the embodiment shown, master latch 102 includes a selection circuit S1 having two inputs. A first input of selection circuit S1 is the normal data input, D, while the second input is the scan data input, SDI. Selection circuit S1 also includes a selection input coupled to receive a scan enable signal in this embodiment. When the scan enable signal is not asserted (e.g., during normal mode operations), data received on the D input may be conveyed through selection circuit S1. When the scan enable signal is asserted, data received via the input SDI may be conveyed through selection circuit S1.

In this particular embodiment, inverter I5 is coupled to the output of selection circuit S1. It is noted however that this, and other inverters are not required in all embodiments. For example, inverters I5, I4, and I3 could all be replaced by non-inverting buffers in an alternate embodiment.

Returning to the embodiment shown in FIG. 3, inverter I5 may provide a complement of the received data to passgate PG1. When active, passgate PG1 may allow the data present on the output of inverter I5 to be conveyed to internal node Int1. In the embodiment shown, passgate PG1 includes a PMOS (p-channel metal oxide semiconductor) transistor having a gate terminal coupled to the output of inverter I1, and an NMOS (n-channel metal oxide semiconductor) having a gate terminal coupled to the output of inverter I2. An input of inverter I1 is coupled to receive a clock signal, while the input of inverter I2 is coupled to receive a complement of the clock signal from the output of inverter I1. Thus, the PMOS transistor of passgate PG1 may receive a complement of the clock signal state in this embodiment, while the NMOS transistor may receive a delayed version of the true clock signal state. Accordingly, the embodiment shown is arranged such that passgate PG1 is active when the clock signal is high, and inactive when the clock signal is low. When active, the data state present on the output of inverter I5 may be conveyed to the internal node Int1.

The data state conveyed to the internal node Int1 of master latch 102 may further be conveyed to the input of inverter I3. Thus, the complementary state of the internal node Int1 (which is the true state of the received from the output of selection circuit S1 in this embodiment) may be provided on the normal data output Q.

In the embodiment shown, the normal data output Q is coupled to gate terminals of transistors P2 and N1, which are PMOS and NMOS transistors, respectively (PMOS transistors are designated with a 'P' in the example, while NMOS transistors are designated with an 'N'). Transistors P2 and N1 are part of keeper 112, which also includes transistors P1 and N2. Since transistors P2 and N1 are of opposite polarities, only one of these two transistors may be active at a given time. On the other hand, transistors N2 and P1 in the embodiment shown are arranged such that both may be activated when the clock signal is low. Accordingly, when the clock signal is low in this embodiment, a pull-up path from internal node Int1 to Vdd may be provided if transistors P1 and P2 are both active, otherwise a pull-down path from Int1 to ground may be provided through transistors N1 and N2. Recall that passgate PG1 in this embodiment is arranged such that it may be active when the clock signal is high. Accordingly, data may be latched to internal node Int1 when the clock signal is high, while keeper 112 may retain the state of internal node Int1 (and thus the output Q) when the clock signal is low.

In this particular embodiment, gating circuit 104 is implemented as a NAND gate that includes transistors P3, P4, N3, and N4. The NAND gate of gating circuit 104 in this embodiment is coupled to internal node Int1 as one input, with the scan enable signal line providing the other input. Internal node Int1 is coupled to respective gate terminals of transistors P3 and N4, while the scan enable signal line is coupled to respective gate terminals of transistors P4 and N3. The output of the NAND gate of gating circuit 104 is coupled to the internal node of slave latch 106, Int2.

It is also noted in the embodiment shown that the source terminals of transistors P3 and P4 are coupled to the junction between transistors P1 and P2, while the source terminal of transistor N4 is coupled to the junction between transistors N1 and N2. Thus, gating circuit 104 in the embodiment shown is arranged such that it may drive internal node Int2 only when transistors P1 and N2 are active, i.e. when the clock signal is low. Otherwise, gating circuit 104 does not drive internal node Int2 when the clock signal is high.

When the clock signal is low, gating circuit 104 may drive internal node Int2 based on the state of the scan enable signal and internal node Int1. When the scan enable signal is deasserted (e.g., low in this embodiment), transistor P4 may be active. If the clock is also low (causing P1 to be active), a pull-up path may be provided between internal node Int2 and Vdd, through transistors P4 and P1. At the same time P4 is active, transistor N3 may be inactive due to the low on its gate terminal from the deasserted scan enable signal. Accordingly, when the scan enable signal is deasserted and the clock is low, internal node Int2 may be pulled high, irrespective of the state of internal node Int1. Holding internal node Int2 high may thus cause the scan data output to be driven low via inverter I4. Thus, since the scan enable signal is deasserted when in the normal mode of operation, the scan data output may be held to a constant state without regard to the state of internal node Int1, including any changes on this node that may occur due to data received via the normal data input.

When the embodiment shown is operating in a scan-shifting mode, the scan enable signal may be asserted as a logic high. When the scan enable signal is asserted, transistor P4 may be inactive while transistor N3 is active. Thus, when the clock signal is low (and thus transistors P1 and N2 are active), gating circuit 104 may drive internal node Int2 according to a state present on internal node Int1. If internal node Int1 is low when the clock signal is also low, transistor P3 may be active, thereby providing a pull-up path between internal node Int2 and Vdd (through P3 and P1). If internal node Int1 is high when the clock signal is low, transistor N4 may be active, and thus a pull-down path between internal node Int2 and ground may be provided through transistors N3, N4, and N2.

Slave latch 106 includes the previously mentioned inverter I4, which is coupled between internal node Int2 and the scan data output. In the embodiment shown, slave latch 106 further includes keeper 116, which in turn includes transistors P5, P6, N5, and N6. Respective gate terminals of transistors P6 and N5 are coupled to the scan data output. The gate terminal of transistor P5 in this embodiment is coupled to receive a complement of the clock signal, while the gate terminal of N6 is coupled to receive a true value of the clock signal (which may be delayed by a small amount via inverters I1 and I2). Thus, transistors P5 and N6 may be active when the clock signal is high. Accordingly, depending on the state of the scan data output, either a pull-up or pull-down path will be provided. If the state of the scan data output is high concurrent with the clock signal being high, a pull-down path may be provided between internal node Int2 and ground through transistors N5 and N6. If the state of the scan data output is low concurrent with the clock signal being low, a pull-up path may be provided between internal node Int2 and Vdd.

Thus, when operating in the scan mode (i.e. scan enable asserted) slave latch 106 may receive data from gating circuit 104 when the clock signal is low, and may retain this data through the operation of keeper 116 after the clock transitions high. Furthermore, since master latch 102 may receive data when the clock signal is high and retain data (through the operation of keeper 112) when the clock falls low, slave latch 106 may operate one half clock cycle later than master latch 102. Thus, during scan shift operations, scan data may be received by a scannable latch 100 through its respective scan data input when the clock signal is high, and may be conveyed to its respective scan data output when the clock signal is low.

It is noted that the embodiments shown in FIGS. 2 and 3 are exemplary. Other embodiments of a scannable latch 100 that fall within the scope of this disclosure are possible and contemplated.

Figure 4:
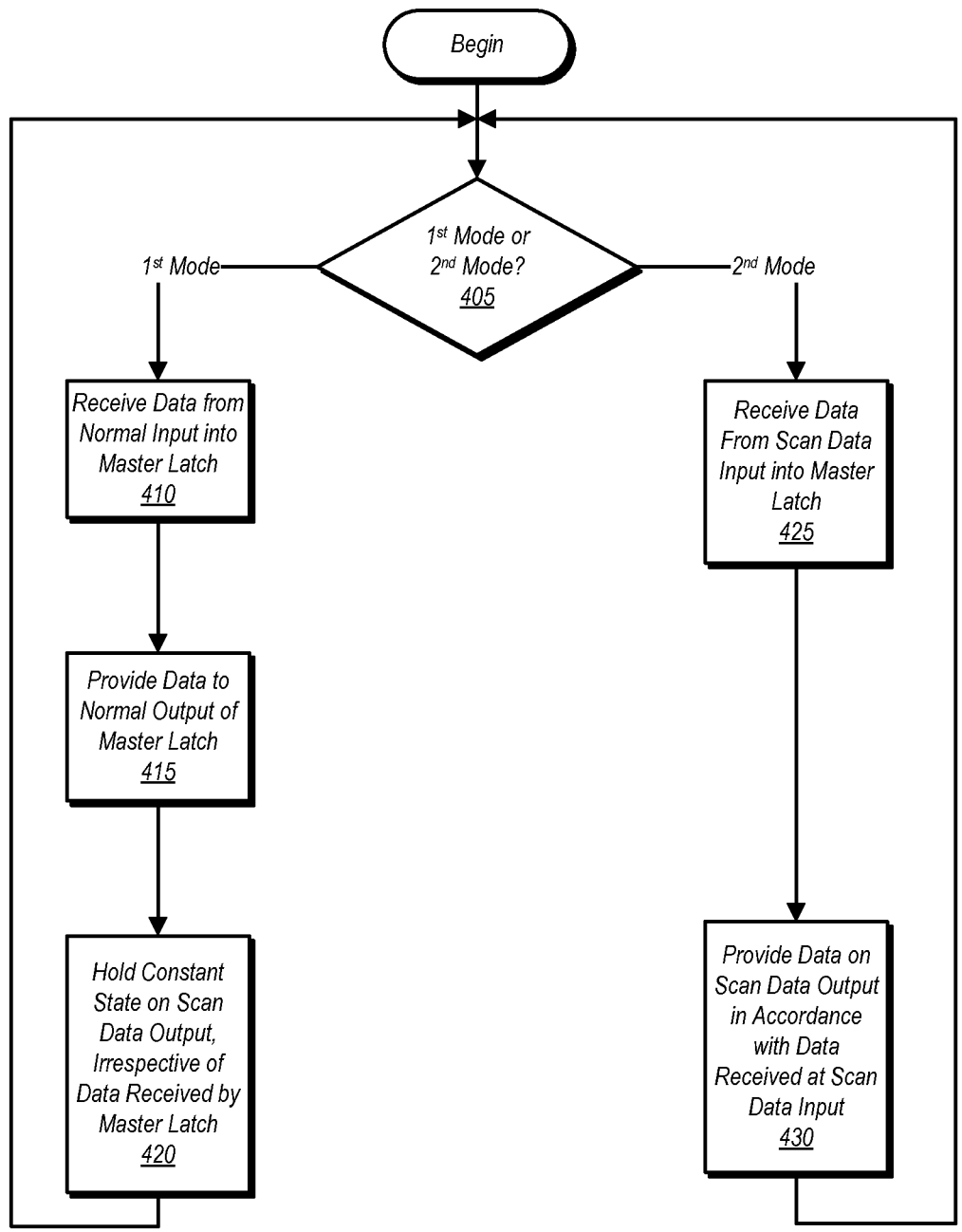
FIG. 4 is a flow diagram of a method for operating one embodiment of a scannable latch.

Method Flow and Timing Diagram:

FIG. 4 is a flow diagram of a method for operating one embodiment of a scannable latch. In the embodiment shown, the flow of method 400 may depend on whether operation of the scannable latch is occurring in a first mode (e.g., a normal operational mode), or a scan mode (e.g., scan-shifting of test stimulus data or captured test result data).

When operation occurs in the first mode (block 405, $1^{st}$ mode), data may be received into a master latch via a normal data input (block 410). The data may be received into the master latch in accordance with a clock signal, e.g., when the clock signal is high. Responsive to the data having been received, the master latch may provide corresponding data on a normal data output (block 415). This may also occur in accordance with a clock signal, which may remain at the required (e.g., high) state long enough to allow the data to propagate through from the normal data input to the normal data output. When the clock transitions to its opposite state (e.g., low), the state of the normal data output may be retained, while the latch may be inhibited from receiving new data until the next clock transition (e.g., back to high).

During operation in the normal mode, the scan data output of the scannable latch may be held to a designated state (e.g., logic low), irrespective of the state of data received by the master latch (block 420). This may be accomplished by a gating circuit or other type of control unit, which may both inhibit new data from being received by a slave latch (from which the scan data output signal is provided), while driving a constant, predetermined state to the latch when operating in the normal mode, thereby causing the constant output state on the scan data output.

Operation of the scannable latch may also be conducted in a second mode (block 405, $2^{nd}$ mode). The second mode may be a mode used to support scan testing, such as a scan-shifting mode. When operating in the second mode data may be received into the master latch through a scan data input instead of through the normal input (block 425). The scan data may be received into the master latch concurrent with the clock signal being at a certain level (e.g., high). When the clock signal then transitions to the opposite level (e.g., low), scan data may be received by the slave latch and provided on a scan data output (block 430). This operation may be controlled by the gating unit, which may allow data to be transferred from the master latch to the slave latch when the clock signals is at the required level concurrent with operation in the scan mode.

It is noted that the various method steps discussed herein may encompass the various circuit operations described above with reference to FIGS. 1-3. For example, holding a constant state on the scan data output (block 420) may include a gating circuit causing a slave latch to drive a scan data output to a designated state when a scan enable signal is deasserted. Similarly, providing data on a scan data output (block 430) may include a gating circuit providing data to an internal node of a slave latch, from which the state of the scan data output may be generated or otherwise conveyed. It is also noted that in some embodiments (e.g., FIG. 3), data received by a master latch may be inverted one or more times before being provided to its intended output.

Figure 5:
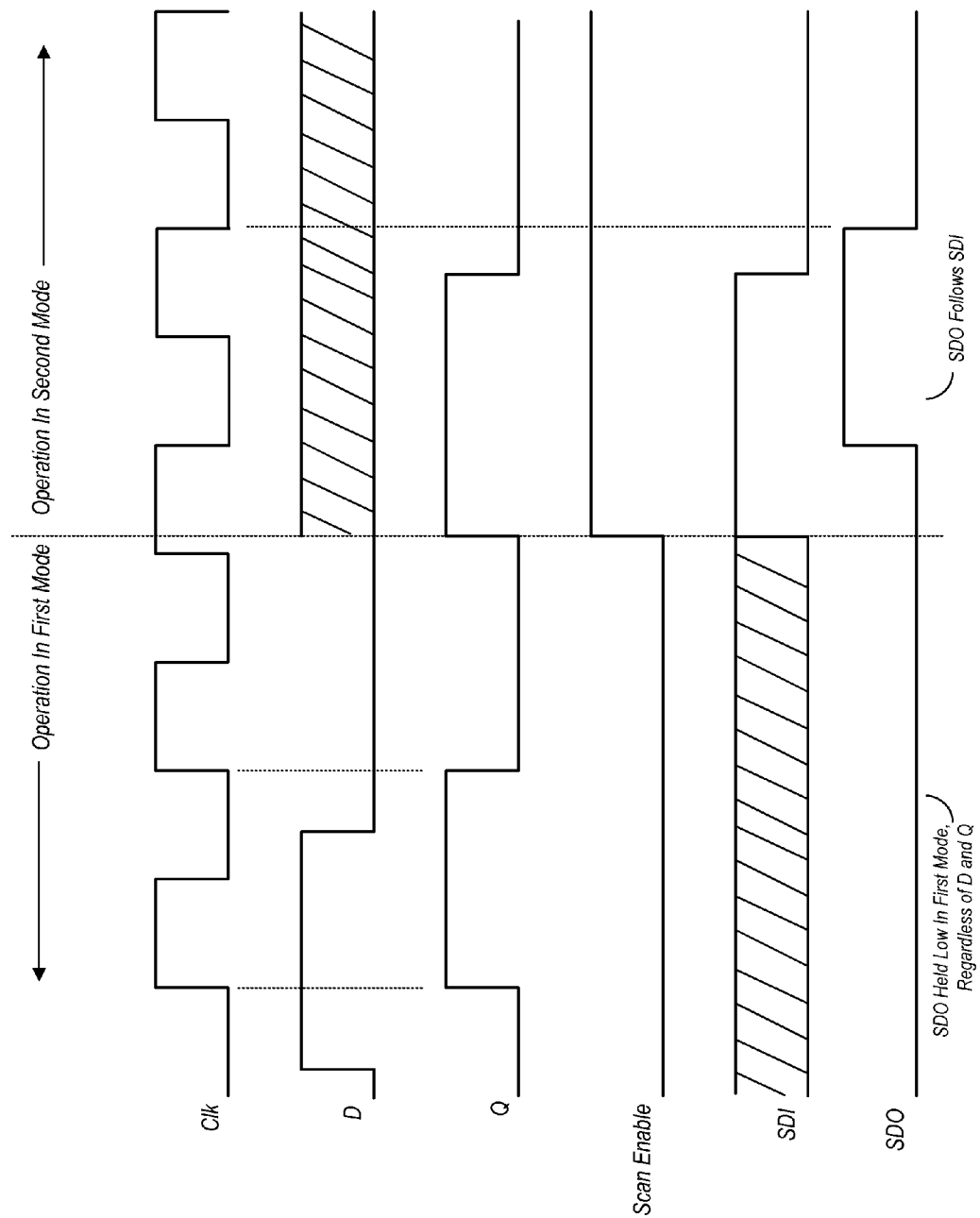
FIG. 5 is a timing diagram illustrating the operation of one embodiment of a scannable latch.

Turning now to FIG. 5, a timing diagram illustrating the operation of one embodiment of a scannable latch is shown. The exemplary timing diagram shown may be applied to the embodiment shown in FIG. 3 above, but may be applied to other embodiments as well. The first half of the timing diagram in this example illustrates operation in a first (e.g., normal) mode, while the second half of the timing diagram illustrated operation in a second (e.g., scan-shifting) mode. When operating in the first mode, the normal data output Q follows the normal data input D, in accordance with a clock signal. Thus, when the state of the input D rises to a logic high, the Q output follows when the clock signal transitions high. When the state of the input D falls to a logic low, the Q output again follows the next time the clock transitions high.

During operation in the first mode, the scan enable signal is deasserted. Accordingly, during both transitions of input D (which may be reflected on an internal node of a master latch), the scan data output remains at a logic low. This may be caused by a gating unit, such as gating unit 104 described above with reference to FIGS. 2 and 3. The gating unit may be arranged to cause the state of the scan data output ('SDO') to remain constant during operation in the normal mode, irrespective of any data received by the master latch.

During operating in the second mode, the scan enable signal is asserted. Thus, data received into the master latch from the scan data input ('SDI') may affect the state of the scan data output. In the example shown, both the scan data input and the clock signal are high when the scan enable signal becomes asserted. When the clock falls low, the state of the scan data output follows that of the scan data input, and thus transitions high. During the next high phase of the clock cycle, the state of the scan data input falls low. Subsequently, when the clock signal falls low again, the state of the scan data output also falls low responsive to the high-to-low transition on the scan data input.

It is noted that while the example shown in FIG. 5 may apply to some embodiments, other embodiments of a scannable latch may operate differently than depicted here while still falling within the scope of the disclosure. For example, embodiments where a normal data output is responsive to the low portion of a clock cycle while the scan data output is responsive to the high portion of the clock cycle are also possible and contemplated.

Figure 6:
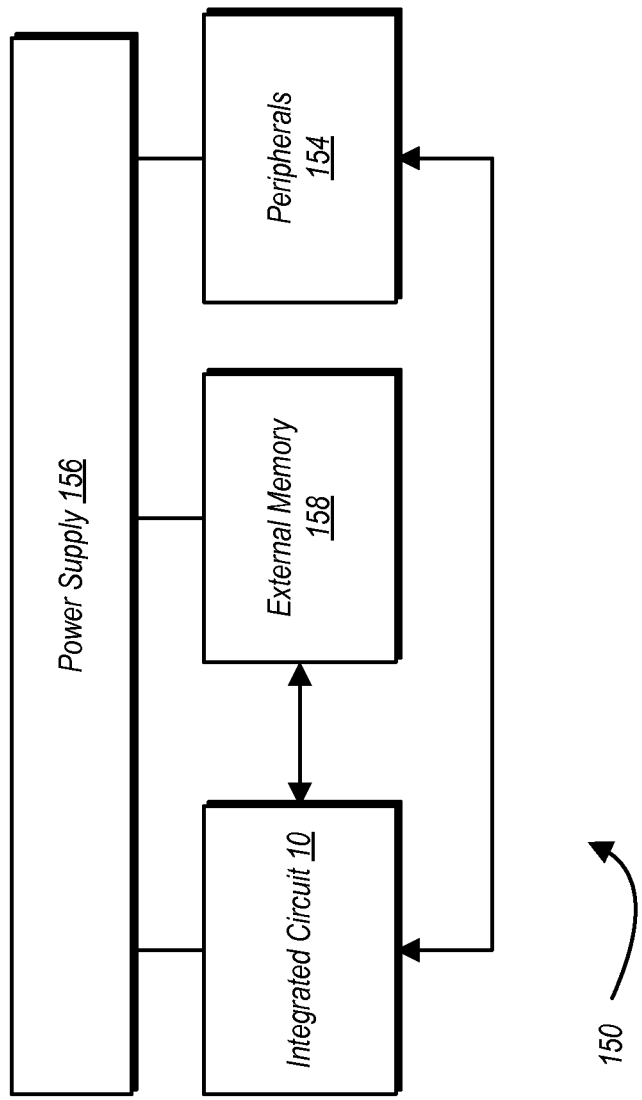
FIG. 6 is a block diagram of one embodiment of a system.

Exemplary System:

Turning next to FIG. 6, a block diagram of one embodiment of a system 150 is shown. In the illustrated embodiment, the system 150 includes at least one instance of an IC 10 (from FIG. 1) coupled to one or more peripherals 154 and an external memory 158. A power supply 156 is also provided which supplies the supply voltages to the IC 10 as well as one or more supply voltages to the memory 158 and/or the peripherals 154. Thus, the power supply 156 may include the voltage regulator 18 shown in FIG. 1. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A latch circuit comprising:
 a master latch having an operational data input, a scan data input, and an internal data node, wherein the master latch is configured to latch data received on the operational data input to the internal data node during operation in a first mode and further configured to latch data received on the scan data input to the internal data node during operation in a second mode;
 a slave latch having a scan data output, wherein the slave latch is configured to generate a scan data output signal having a state corresponding to a state of the internal data node during operation in the second mode, wherein the master and slave latches are each coupled to receive a clock signal; and
 a gating circuit, wherein the gating circuit is configured to cause the slave latch hold the scan data output to a constant state, irrespective of the state of the clock signal and the state of the internal data node, during operation in the first mode.

2. The latch circuit as recited in claim 1, wherein the gating circuit comprises a logic gate having a first input coupled to the internal node and a second input coupled to receive a scan enable signal, and wherein the logic gate is configured to cause the slave latch to hold the scan data output at the constant state when the scan enable signal is deasserted.

3. The latch circuit as recited in claim 2, wherein the slave latch is configured to latch data from the internal node to the scan data output, responsive to the clock signal and when the scan enable signal is asserted, the clock signal having a first phase and a second phase.

4. The latch circuit as recited in claim 3, wherein the master latch is configured to latch data from one of the operational data input or the scan data input to the internal node responsive during a first phase of the clock signal, and wherein the slave latch is configured to latch data to the scan data output during a second phase of the clock signal.

5. The latch circuit as recited in claim 3, wherein the master latch further comprises an operational data output, wherein the master latch is configured to latch data from to the operational data output during a first phase of the clock signal, and further configured to hold a state of the operational data output during a second phase of the clock signal.

6. An integrated circuit comprising:
 a scan chain comprising a plurality of serially coupled scannable latches, wherein each of the scannable latches includes:
  a first latch configured to latch a data received on a normal data input during operation in a normal mode, to latch data received on a scan data input during operation in a scan-shifting mode, and responsive to latching the data, to store a data bit corresponding to the data;
  a second latch configured to latch the data bit during operation in the scan-shifting mode, wherein the first and second latches are each coupled to receive a clock signal; and
  a logic circuit coupled between the first latch and the second latch, wherein the logic circuit is configured to cause the second latch to provide a predetermined logic value during operation in the normal mode, irrespective of a state of the data bit and a state of the clock signal.

7. The integrated circuit as recited in claim 6, wherein the logic circuit of each of the plurality of scannable latches is configured to enable the corresponding second latch to latch the data bit and to provide the data bit on a respective scan data output when a scan enable signal is asserted.

8. The integrated circuit as recited in claim 6, wherein the clock signal has a first phase and a second phase, and wherein the first latch of each of the plurality of scannable latches is configured to latch data received at one of its respective normal or scan data inputs responsive to the clock signal transitioning to the first phase, and wherein the first latch of each of the plurality of scannable latches is configured to retain a state corresponding to the data received during a second phase.

9. The integrated circuit as recited in claim 8, wherein the second latch of each of the plurality of scannable latches is configured to generate a scan data output signal based on the data bit during the second phase of the clock signal when operating in the scan-shifting mode.

10. The integrated circuit as recited in claim 6, wherein the normal data input of one or more of the scannable latches is coupled to a first logic circuit, and wherein the normal data output of one or more of the scannable latches is coupled to a second logic circuit.

11. A storage circuit comprising:
 a data storage unit configured to store a state of a first data bit based on a signal received from a selected one of first and second selectable inputs, wherein data storage unit is configured to select the first input when operating in an operational mode and further configured to select the second input when operating in a scan mode;
 a control unit configured to generate a second data bit having a state that corresponds to the state of the first data bit when operating in the scan mode; and
 a scan unit coupled to receive the second data bit from the control unit when operating in the scan mode and configured to provide a corresponding signal on a scan data output, wherein the scan unit and the data storage unit are each coupled to receive a clock signal;
 wherein the control unit is further configured to cause the scan unit to hold the scan data output to a predetermined state when operating in the operational mode, regardless of the state of the first data bit and regardless of a state of the clock signal.

12. The storage circuit as recited in claim 11, wherein the clock signal has a first level and a second level, wherein the control unit is coupled to receive the first data bit from the data storage unit and further coupled to receive a scan enable signal, wherein the control unit is configured to provide the second data bit when the scan enable signal is asserted concurrent with a clock signal being at a second level, and wherein the control unit is further configured to cause the scan unit to hold the scan data output to the predetermined state when the scan enable signal is not asserted.

13. The storage circuit as recited in claim 12, wherein the scan unit is configured to provide the corresponding signal on the scan data output when operating in the scan mode concurrent with the clock signal being at a second level.

14. The storage circuit as recited in claim 13, wherein the data storage unit includes an operational data output, and wherein the data storage unit to provide an output signal on the operational data output when operating in the operational mode concurrent with the clock signal being at the first level.

15. The storage circuit as recited in claim 13, wherein the data storage unit includes a first keeper configured to retain a state of the operational data output when the clock signal is at the second level, and wherein the scan unit includes a second keeper configured to retain a state of the scan data output when the clock signal is at the first level.

16. A method comprising:
- a slave latch of a latch circuit providing a first data signal on a scan data output when operating in a scan mode, wherein a state of the first data signal is based on a state of first input data received on a scan input of a master latch coupled to the slave latch;
- the master latch providing a second data signal on a normal data output when operating in a normal mode, wherein the state of the second data signal is based on a state of second input data received on a normal data input of the master latch, wherein the master and slave latches are each configured to receive a clock signal; and
- a gating circuit causing the slave latch to hold the scan data output at a constant state, irrespective of a state of the clock signal and signal states present on either the normal data input or the scan data input when operating in the normal mode.

17. The method as recited in claim 16, further comprising the gating circuit enabling the latch circuit to operate in the scan mode responsive to assertion of a scan enable signal, and further comprising the gating circuit enabling the latch circuit to operate in the normal mode when the scan enable signal is deasserted.

18. The method as recited in claim 16, further comprising:
- the master latch setting a state of a master latch internal node responsive receiving the first input data when the clock signal is at a first level and while operating in the scan mode;
- the gating circuit setting a state of a slave latch internal node, based on the state of the master latch internal node, when the clock signal is at a second level while operating in the scan mode;
- the slave latch providing the first data output signal on the scan data output responsive to the gating circuit setting the state of the slave latch internal node; and
- the slave latch retaining a state of the scan data output when after the clock signal transitions to the first level.

19. The method as recited in claim 18, further comprising:
- the master latch setting the state of a master latch internal node responsive receiving the second input data when the clock signal is at the first level while operating in the normal mode;
- the master latch providing the second data signal on the normal data output at a state corresponding to the state of the master latch internal node when the clock signal is at the first level when operating in the normal mode; and
- the master latch retaining a state of the second data signal on the normal data output subsequent to the clock transitioning to a second level.

20. The method as recited in claim 18 further comprising:
- the gating circuit receiving the scan enable signal and the state of the master latch internal node;
- the gating circuit setting the state of the slave latch internal node based on the state of the master latch internal node when the scan enable signal is asserted; and
- the gating circuit setting the state of the slave latch to the constant state when the scan enable signal is deasserted.

21. A circuit comprising:
- a selection circuit having a first input and a second input, wherein the selection circuit is configured to select the first input when operating in a first mode and the second input when operating in a second mode;
- a passgate coupled to an output of the selection circuit, wherein the passgate is configured to, when active, convey a state of the output of the selection circuit to a first internal node;
- a first output circuit coupled between the first internal node and a first output node;
- a NAND gate having a first input coupled to the first internal node and a second input coupled to receive a scan enable signal, wherein the NAND gate further includes an output coupled to a second internal node; and
- a second output circuit coupled between the second internal node and a second output node, wherein the NAND gate is configured to cause the second output circuit to generate a scan data output signal in accordance with a state of the first internal node when the scan enable signal is asserted, and wherein the NAND gate is further configured to cause the output circuit to generate a scan data output having a constant value irrespective of the state of the second internal node when the scan enable signal is not asserted.

22. The circuit as recited in claim 21, wherein the passgate is configured to activate when a clock signal transitions to a first level, and further configured to deactivate when the clock signal transitions to a second level.

23. The circuit as recited in claim 21, further comprising:
- a first keeper circuit, wherein the first keeper circuit is configured to retain a state of the first internal node when the clock signal is at the second level; and
- a second keeper circuit, wherein the second keeper circuit is configured to retain a state of the second internal node when the clock signal is at the first level.

24. The circuit as recited in claim 23, wherein the NAND gate is configured to drive the second internal node when the clock signal is at the second level, and wherein the first keeper circuit is configured to inhibit the NAND gate from driving the second internal node when the clock signal is at the first level.

25. The circuit as recited in claim 21, wherein the first output circuit is configured to drive an output signal on the output node in accordance with a state of the first internal node.

* * * * *